United States Patent
Ali et al.

(10) Patent No.: US 12,181,526 B2
(45) Date of Patent: Dec. 31, 2024

(54) ANOMALY DETECTION FOR ROTATING MACHINES

(71) Applicant: General Electric Company

(72) Inventors: Shahid Ali, Bengaluru (IN); Sumitha Mohan, Bengaluru (IN); Balakrishna Pamulaparthy, Hyderabad (IN)

(73) Assignee: GE INFRASTRUCTURE TECHNOLOGY LLC, Greenville, SC (US)

( * ) Notice: Subject to any disclaimer, the term of this patent is extended or adjusted under 35 U.S.C. 154(b) by 178 days.

(21) Appl. No.: 17/796,610

(22) PCT Filed: Aug. 11, 2020

(86) PCT No.: PCT/US2020/045769
§ 371 (c)(1),
(2) Date: Jul. 29, 2022

(87) PCT Pub. No.: WO2022/035423
PCT Pub. Date: Feb. 17, 2022

(65) Prior Publication Data
US 2023/0057924 A1     Feb. 23, 2023

(51) Int. Cl.
*G01R 31/34*     (2020.01)
*G01M 13/00*     (2019.01)
(Continued)

(52) U.S. Cl.
CPC ........... *G01R 31/343* (2013.01); *G01M 13/00* (2013.01); *G01P 3/44* (2013.01); *H02P 23/14* (2013.01); *H02P 29/024* (2013.01)

(58) Field of Classification Search
CPC ................................ G01R 31/343; G01P 3/44
See application file for complete search history.

(56) References Cited

U.S. PATENT DOCUMENTS 9,604,543 B2 * 3/2017 Hu ..................... H02H 1/0092
9,791,856 B2 * 10/2017 Hatch ................ G05B 23/0235
(Continued)

FOREIGN PATENT DOCUMENTS

EP     1489475 A2     12/2004
EP     2919027 A1     9/2015
(Continued)

OTHER PUBLICATIONS

Extended European Search Report and Written Opinion issued in PCT/US2020/045769 dated May 6, 2021, 15 pages.

*Primary Examiner* — Reena Aurora
(74) *Attorney, Agent, or Firm* — Eversheds Sutherland (US) LLP (57) ABSTRACT

The present disclosure relates to systems and methods for improved anomaly detection for rotating machines. An example method may include determining a rotational speed of a rotating machine; determining, using a frequency domain transform of a signal, a frequency domain signal; determining, based on the rotational speed, a first frequency band within the frequency domain signal for identifying a fault frequency; determining a fault frequency within the first frequency band; determining, based on the fault frequency, a second frequency band within the first frequency band, wherein the second frequency band includes the fault frequency; determining, based on the second frequency band, a first fault index and a baseline of the first fault index; determining, based on a deviation of a second fault index from the baseline, a fault condition; and providing an alert based on the fault condition.

20 Claims, 8 Drawing Sheets

(51) Int. Cl.
*G01P 3/44* (2006.01)
*H02P 23/14* (2006.01)
*H02P 29/024* (2016.01)

(56) References Cited

U.S. PATENT DOCUMENTS 11,499,889 B1 * 11/2022 Bowers, III ........... G01H 1/003
2013/0218491 A1 * 8/2013 Wei ..................... G01R 31/52
702/58

FOREIGN PATENT DOCUMENTS

EP 3419162 A1 12/2018
WO 2020144600 A1 7/2020

* cited by examiner

ANOMALY DETECTION FOR ROTATING MACHINES

CROSS-REFERENCE TO RELATED APPLICATIONS

This application is a U.S. National Stage Application under 35 U.S.C. 371 and claims the priority benefit of International Application No. PCT/US2020/045769, filed Aug. 11, 2020, which is incorporated herein by reference.

TECHNICAL FIELD

The present disclosure relates to systems and methods for anomaly detection in rotating machines (in some cases, the terms "machine" and "motor" may be used interchangeably herein). In some embodiments, the disclosure may more particularly relate to early fault detection in rotating machines (for example, both for line-fed and variable-frequency drive (VFD) fed induction and synchronous machines).

BACKGROUND

Electrical Signature Analysis (ESA) is a widely used method for detecting faults in rotating machines using measured current and voltage signals. It is to be ensured that these fault detection algorithms work properly based on measurements available at the site on installation and also for a wide range of applications for which the rotating machines are deployed. Often, standard settings are used in intelligent electronic devices (IEDs) for anomaly detection which does not lend itself well for use for different types of machines and applications.

There currently exist many different methods for detecting such anomalies. A first example conventional method discussed in WO Patent Publication No. 2011158099 titled "System and Method of Speed Detection in an AC Induction Machine" involves a linear speed estimation algorithm based on nameplate information. Nameplate information may refer to defined parameters for the machine, such as power factor, efficiency, torque, and current are at rated voltage and frequency, among other parameters. This method may estimate rotor speed using the frequency domain (for example, based on slot harmonics for estimation of a number of rotor bars) and determine the rotor speed is valid. If the rotor speed is valid, then a tuned rotor speed is determined based on part by the linear estimation algorithm and in part by the frequency domain analysis. A second example conventional method discussed in WO Patent Publication No. 2019167086 titled "A System for Assessment of Multiple Faults in Induction Motors" involves conditioning an input signal to remove a fundamental component, and estimating slip and rotor speed by finding mixed eccentricity fault component that is inherently present in all motors. A third example conventional method discussed in U.S. Pat. No. 6,449,567 titled "Apparatus and Method for Determining Shaft Speed of a Motor" involves calculating shaft speed based on a shaft frequency peak from a demodulated current signal (amplitude demodulated current to obtain instantaneous current and find candidate peaks). The third example conventional method also determines a pole pass frequency (for example, as difference in angle between instantaneous current phase and instantaneous voltage phase). The final shaft speed may be determined from the pole pass frequency and the shaft speed determined from the shaft frequency peak.

BRIEF DESCRIPTION OF THE DRAWINGS

The detailed description is set forth with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale. Throughout this disclosure, depending on the context, singular and plural terminology may be used interchangeably.

DETAILED DESCRIPTION

Overview

In some embodiments, the disclosure is directed to systems and methods for improved anomaly detection for rotating machines. In some embodiments, the systems and methods described herein may improve upon conventional anomaly detection systems and methods (such as the three described above, for example) in certain cases and more specifically may describe a broader approach to improved anomaly detection for different types failure modes of the machine (for example eccentricity, broken rotor bar, or bearing fault failure modes). In some embodiments, one of the improvement of the systems and methods described herein may include improved motor speed estimation. This may be beneficial in various technical solutions because the estimated motor speed may be subsequently be used to determine fault index baselines for different types of failure modes, which may then be used as baselines to identify faults in the machine (which may be described below, for example, with reference to at least FIG. 3) during real-time operation of the machine subsequent to the baselines being established.

In some embodiments, the improved motor speed estimation may allow speed estimation to be performed even in the absence of voltage measurements from the machine. Voltage measurements may be unavailable, for example, the machine does not include any sensors capable of determining the voltage levels of the machine. As a second example, voltage measurements may also be unavailable if voltage sensors do exist but are experiencing an impairment and are unable to collect and/or provide voltage measurement data. As a third example, voltage measurements may also be unavailable if there are harmonics in the voltage. Voltage measurements may be unavailable in a machine for any number of additional reasons as well. Motor speed estimation may be performed even in the absence of voltage measurements by either using either the torque component of current or leveraging inherent machine asymmetries (in machines that are inherently asymmetrical). However, the improved motor speed estimation methods described herein may also be used when voltage measurements are available from the machine as well. These improved speed estimation methods may be depicted with respect to FIGS. 1-3.

In some embodiments, when voltage measurements are available, the systems and methods described herein may improve upon the motor speed estimation by normalizing the determined input power of the machine based on its operating frequency. The input power of the machine may be a variable that may be commonly used in speed estimation of a machine, however, this normalization may improve upon this usage by accommodating for frequency variations when operating the machine with a Variable Frequency Drive (VFD) (a VFD may be a type of motor controller that drives an electric motor by varying the frequency and voltage supplied to the electric motor). For example, for a rated machine power of 8 kW (at 50 Hz), assuming a constant V/F operation, when the machine is operated at a frequency of 30 Hz, the maximum power drawn may be less than 8 kW although the current drawn may be the same as at full load as at 50 Hz. When the machine is operated at 60 Hz, the maximum power drawn for a constant V/F may be more than 8 kW. The computed power thus may need to be normalized with respect to the actual operating frequency. The normalized input power, Pin_norm may be determined through the following equations, for example:

$$Pin = Va*Ia + Vb*Ib + Vc*Ic \quad \text{(Equation 1)}$$

$$Pin\_norm = Pin*(freq\_rated/fund\_freq) \quad \text{(Equation 2)}$$

$$Pin = \text{mean}(Va*Ia + Vb*Ib + Vc*Ic) \quad \text{(Equation 3),}$$

where Va, Vb, and Vc may be the integral cycles of the acquired phase voltages, Ia, Ib and Ic may be the integral cycles of the acquired currents, freq_rated may be the nameplate frequency rating of the machine, fund_freq may be the operating frequency of the machine, Pin may be the calculated input power of the machine, and Pin_norm may be the normalized power for the machine. Once the normalized input power is determined, the motor speed may then be determined using the normalized input power and a rated slip speed of the motor. The rated slip speed of the motor may be a difference between a synchronous speed, sync_speed, of the machine's magnetic field and the actual rating rated speed of a shaft of the machine, rated_speed.

$$rated\_slip\_speed = 120*freq\_rated/P - rated\_speed \quad \text{(Equation 4)}$$

$$sync\_speed = 120*fund\_freq/P \quad \text{(Equation 5)}$$

The motor speed, motor_speed, may be determined using the following equations, when the fundamental frequency is less than or equal to the rated frequency of the machine, for example:

$$motor\_speed = sync\_speed - \text{abs}(Pin\_norm/Pin\_rated)*rated\_slip\_speed \quad \text{(Equation 6)}$$

The motor speed, motor_speed, may be determined using the following equations, when the fundamental frequency is greater than the rated frequency, for example:

$$motor\_speed = sync\_speed - \text{abs}(Pin/Pin\_rated)*rated\_slip\_speed \quad \text{(Equation 7)}$$

The use of the actual input power instead of the normalized power for frequencies greater that the rated frequency of the machine may correct for the overestimate of the speed if the normalized power were to be used.

In some embodiments, when voltage measurements are not available, the systems and methods described herein may improve upon speed estimation by estimating the speed using only the current measurements from the machine. In particular, the speed estimation may be performed by using the torque component of the measured current, more specifically, in some cases, when the machine is operated with a constant V/f ratio. The torque component of the current may be determined using the following equations, when the operating frequency is less than the rated frequency of the machine, for example:

$$Imn\_rated = Irated*\sin(phi) \quad \text{(Equation 8)}$$

To account for non-linear V/f operation, the rated magnetization current may be normalized with the operating frequencies for frequencies greater than the rated frequency, for example:

$$Imn\_rated = Irated*\sin(phi)*freq\_rated/fund\_freq \quad \text{(Equation 9)}$$

$$Itrq\_rated = \sqrt{Irated^2 - Imn\_rated^2} \quad \text{(Equation 10)}$$

$$Itrq = \sqrt{Irms^2 - Imn\_rated^2} \quad \text{(Equation 11),}$$

where phi is the rated power factor angle of the machine, Imn_rated is the rated magnetization current of the machine, Irated is the rated current of the machine, Itrq is the actual torque component of the current of the machine, Itrq_rated is the rated torque component of the current of the machine, and Irms is calculated from a fast Fourier transform (FFT) of the stator current peak at the fundamental frequency of the machine as Ipeak/sqrt(2). The actual torque component of the current (Itrq) is determined, the motor speed may be estimated using the normalized power and the rated slip speed using the following equations:

$$rated\_slip\_speed = 120*freq\_rated/P - rated\_speed \quad \text{(Equation 12)}$$

$$sync\_speed = 120*fund\_freq/P \quad \text{(Equation 13)}$$

$$motor\_speed = sync\_speed - \text{abs}(Itrq/Itrq\_rated)*rated\_slip\_speed; \quad \text{(Equation 14)}$$

where fund_freq may be the fundamental frequency of the machine and P may be the number of poles of the machine.

In some embodiments, a third example improvement of the systems and methods described herein may include an improved fault detection methodology and fault index computation. Conventional systems may use frequency search bands with the operating frequency range of a machine to determine frequency ranges to search for fault frequencies. The systems and methods may optimize these search bands by adjusting the range of the search band (for example, the frequency range of the search band) based on factors such as the type of machine involved and/or the manner in which the speed estimation is performed (for example, as may be described with respect to FIGS. 1-2 below). The search band size may also be optimized based on a confidence level associated with an estimated motor speed for a machine. For example, a more narrow search band may be used when a certain types of speed estimation are used, such as when input power, a torque component of the current, or machine asymmetry are used (which may be more accurate speed estimations, for example) and a wider search band may be used based on methods of speed estimation that may not involve these elements (for example, which may be lower accuracy methods of speed estimation). Examples of such optimized search and sum bands may also be depicted with respect to FIGS. 4A-4C. These optimized search and sum bands may be beneficial in that they may reduce the range of frequencies that may need to be monitored to identify a fault frequency.

In some embodiments, additional improvements by the systems and method described herein may include predetermining the data length, sampling frequency (to ensure that the fault frequency can be captured appropriately based on the Nyquist criterion), and frequency resolutions used for collecting data from a given machine depending on the machine nameplate ratings and application. Additionally, one or more data quality checks may also be performed on the collected data to ensure that the quality of the collected data is sufficient and does not have any transients in the recorded time length for accurate anomaly detection to be performed. Additional post-processing of data to ensure integral number of cycles for FFT analysis may be performed.

Figure 1:
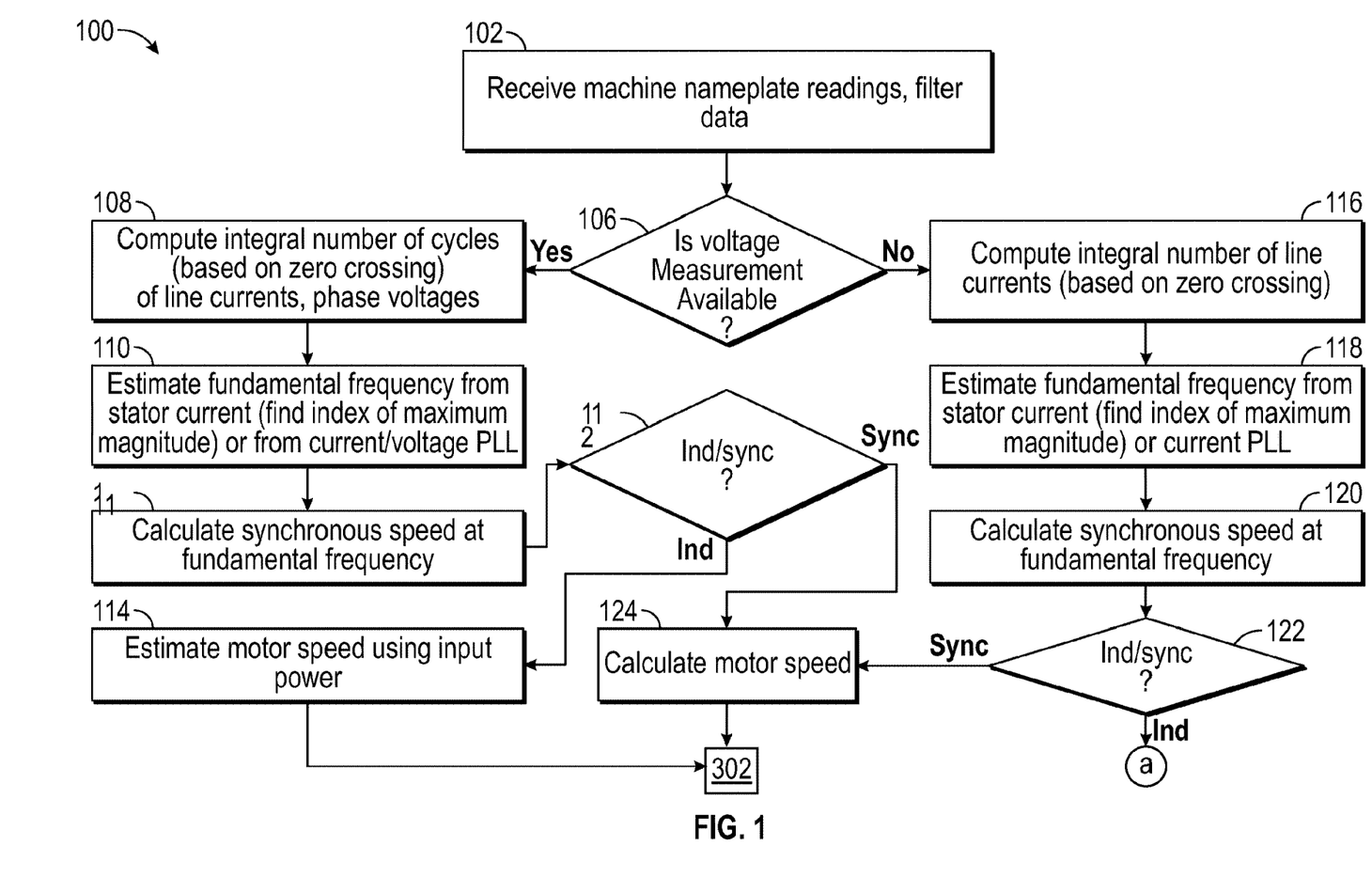
FIG. 1 depicts example flow chart, in accordance with one or more example embodiments of the disclosure.

Turning to the figures, FIG. 1 provides a more detailed flow chart 100 outlining the operations that may be performed for the speed estimation of the machine. In some embodiments, the operations described herein may be performed by a computing device (for example, computing device 600), which may be located locally to the machine or remotely from the machine. The flow chart 100 may begin with operation 102, which may involve receiving machine nameplate information and filtered data. As described above, machine nameplate information may refer to known parameters associated with the machine, such as a power factor, efficiency, torque, and current at a rated voltage and frequency of the machine, among other parameters. Filtered data may refer to predetermined data lengths and frequency resolutions that may be used for data collection from the machine, and may also correspond to any number of quality checks that may be performed on any data that is collected from the machine. Once an initial operation of receiving machine nameplate information and filtering data is performed, subsequent operations of flow chart 100 may depend on whether voltage measurements from the machine are available or not (that is, whether voltage measurements are able to be obtained from the machine). As one example, voltage measurements may be unavailable, for example, the machine does not include any sensors capable of determining the voltage levels of the machine. As a second example, voltage measurements may also be unavailable if voltage sensors do exist but are experiencing an impairment and are unable to collect and/or provide voltage measurement data. As a third example, voltage measurements may also be unavailable if there are harmonics in the voltage. Voltage measurements may be unavailable in a machine for any number of additional reasons as well. Based on this, operation 106 of the flow chart 100 may include a first condition that determines whether voltage measurements are available from the machine. If the voltage measurements are determined to be available (the answer to the first condition of operation 106 is yes), the flow chart 100 may proceed to operation 108. Otherwise, if voltage measurements are determined to be unavailable, the flow chart 100 may proceed to operation 116. Voltage measurements may be unavailable, for example, the machine does not include any sensors capable of determining the voltage levels of the machine. As a second example, voltage measurements may also be unavailable if voltage sensors do exist but are experiencing an impairment and are unable to collect and/or provide voltage measurement data. As a third example, voltage measurements may also be unavailable if there are harmonics in the voltage. Voltage measurements may be unavailable in a machine for any number of additional reasons as well.

In some embodiments, if it is determined through the first condition of operation 106 that the voltage measurements are available from the machine, then the flow chart 100 may proceed with operation 108, which may involve determining an integral number of cycles of one or more line currents and/or phase voltages. This integral number of cycles (in a waveform of these values) may be determined based on a zero crossing of Ia, where Ia may refer to a phase a current and a zero crossing may refer to a zero crossing of a waveform of Ia. Using the integral number of cycles of the acquired currents or voltages may prevent spectral leakage that may interfere with detection of specific fault frequencies and may provide a better signal to noise ratio when compared to a baseline. From operation 108, the flow chart 100 may proceed to operation 110, which may include estimating a fundamental frequency of the machine. The fundamental frequency may be a base frequency of operation for the machine. The fundamental frequency may be determined from the stator current of the machine using the frequency of the maximum magnitude in the stator current spectrum, or may be determined from the current and/or voltage phase-locked loop (PLL). That is, a PLL may be run on the signal to identify a fundamental frequency and an overall time duration. For example, if it is known that the fundamental frequency is 50 Hz then it may be determined what time is required for one cycle. Once the fundamental frequency and the synchronous speed of the machine is known, the flow chart 100 may proceed with operation 111, which may involve determining the synchronous speed of the machine at the determined fundamental frequency. The synchronous speed of the machine at the fundamental frequency may be determined using an equation as presented above, for example. That is, the synchronous speed may be a function of the fundamental frequency and the number of poles in the machine. The flow chart 100 may then proceed to operation 112, which may include a second condition. The second condition may involve a determination as to whether the machine is a synchronous machine or an induction machine, which may be determined through the nameplate of the machine. If it is determined that the machine is an induction machine, then the flow chart 100 may proceed to operation 114. If it is determined that the machine is a synchronous machine, then the flow chart 100 may proceed to operation 124. At operation 114, the motor speed of the machine may be estimated using input power of the machine, for example, one or more equations presented above. At operation 124, the motor speed may be determined to be the same as the synchronous speed of the machine because the machine is determined to be a synchronous machine. Subsequent to operation 114 and/or operation 124, the flow chart 100 may proceed to operation 302 of the flow chart 300 depicted in FIG. 3.

Continuing with FIG. 1 and flow chart 100, if voltage measurements from the machine are determined to be unavailable at operation 106, the flow chart 100 may proceed to operations 116-122, which may include similar operations to operations 108-112 of the flow chart 100 that may be performed if voltage measurements are determined to be available. That is, operation 116 may involve computing an integral number of cycles of line currents and/or phase voltages. Operation 118 may involve estimating a fundamental frequency of the machine. Operation 120 may involve determining the synchronous speed of the machine at the fundamental frequency. Additionally, operation 122 may include a third condition which may be the same condition as the first condition of operation 112. That is, the third condition may involve a determination as to whether the machine is an inductance machine or a synchronous machine. If the machine is determined to be a synchronous machine, then the flow chart 100 may again proceed to operation 124, where the motor speed may be determined to be the synchronous speed of the machine. However, if the machine is determined to be an inductance machine, then the flow chart 100 may proceed to operation 202 within flow chart 200 depicted in FIG. 2 (which may be a continuation of flow chart 100 presented in FIG. 1). Thus, the determination of the estimated motor speed for induction machines when voltage measurements are available from the machine may differ from the determination of the estimated motor speed for induction machines when voltage measurements are unavailable from the machine.

Figure 2:
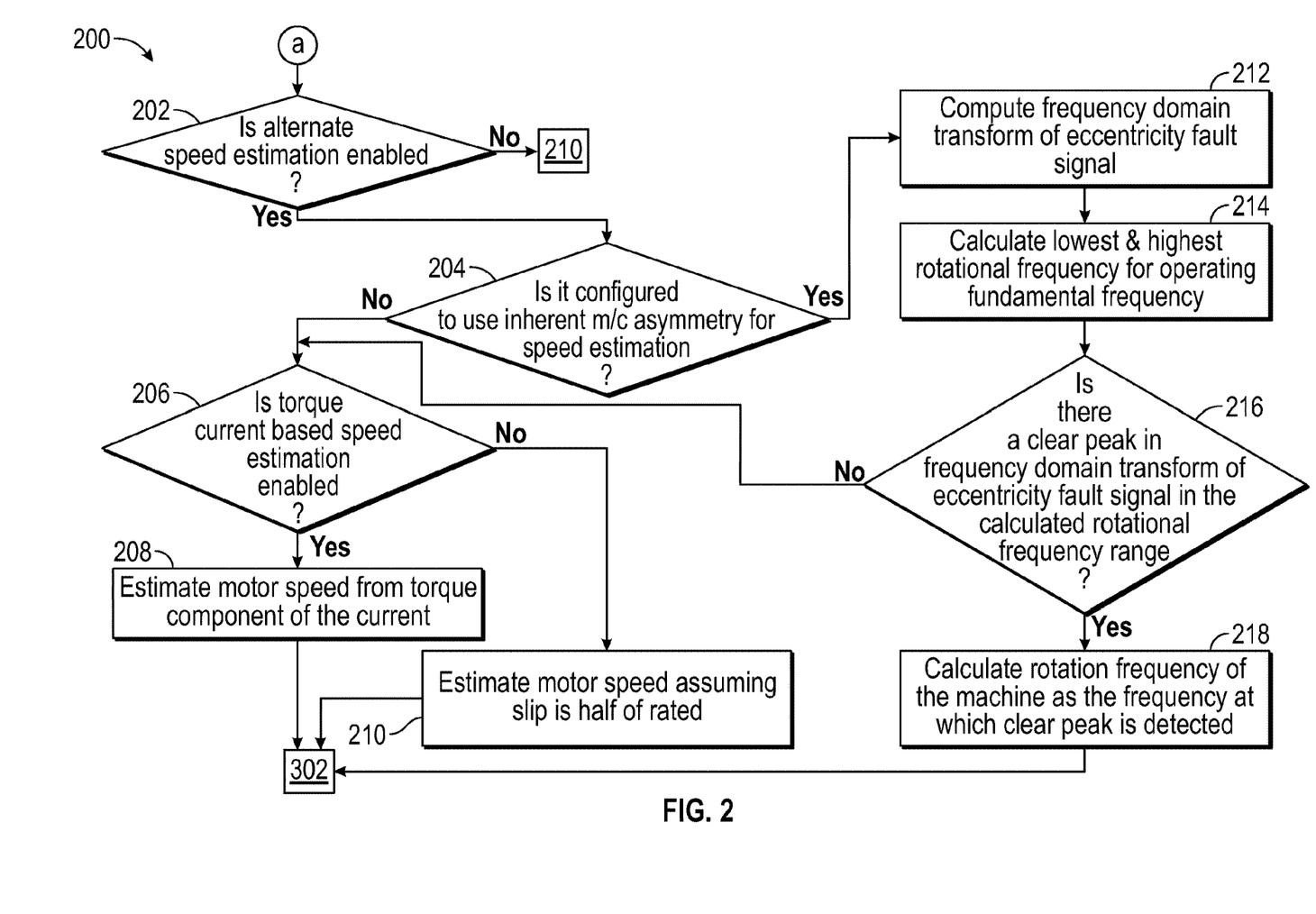
FIG. 2 depicts an example flow chart, in accordance with one or more example embodiments of the disclosure.

Turning to FIG. 2, the flow chart 200 may include operations used to determine the estimated motor speed of an induction machine when voltage measurements may not be available. The flow chart 200 may begin with operation 202. Operation 202 may include a condition that determines if alternate speed estimation is enabled in the machine. Alternate speed estimation may be established during the commissioning of the machine and may be based on whether particular sensors are available for data collection. If it is determined that alternate speed estimation is not enabled, then the flow chart 200 may proceed to operation 210. Otherwise, the flow chart 200 may proceed to operation 204. Operation 204 may include a condition that determined whether the machine is an has an inherent asymmetry. A machine may have an inherent asymmetry because manufacturing tolerances of the machine may not be perfectly balanced, for example. A machine with an inherent asymmetry may have a significant peak in a stator current spectrum at or nearby the rotational frequency of the machine. It may be determined if the machine is an asymmetrical machine, for example, it is determined that the machine is not operating in a constant V/F mode. When a machine is operating in a constant V/F mode, the machine maintains a certain V/Hz ratio at all times. This may differ from, for example, a vector control mode, in which voltage and frequency are manipulated to produce an optimum V/Hz ratio for maximum torque of the machine. Whether the machine is operating in a constant V/F mode may be known, as it may be established during commissioning or installation. If it is determined that the machine is configured to use inherent asymmetry for speed estimation, then the flow chart 200 may proceed to operation 212. At operation 212, a frequency domain transform of an eccentricity fault signal of the machine may be performed. Any machine asymmetry may produce a distinct peak in the eccentricity frequency which may correspond to the machine speed in Hz in the stator current spectrum. For example, the frequency domain transform may be based on a Fast Fourier Transform (FFT), Discrete Fourier Transform (DFT), or Short-time Fourier Transform (STFT), among other frequency domain transforms. The flow chart 200 may then proceed to operation 214, which may involve determining a lowest rotational frequency and a highest rotational frequency for the operating fundamental frequency of the machine. This may be performed based on a fundamental frequency of the machine and a nameplate slip speed of the machine, for example. The lowest frequency may correspond to the minimum rotational speed at maximum loading of the machine and the highest frequency may correspond to the synchronous speed of the machine. The lowest rotational frequency and a highest rotational frequency may then be used to establish a rotational frequency range for the machine. Once the lowest rotational frequency and a highest rotational frequency are determined, the flow chart 200 may proceed to operation 216, which may involve a condition determining is there is a clear peak in the frequency domain transform of the eccentricity fault signal in the rotational frequency range determined in operation 214. A clear peak may be determined based on a magnitude of current at the estimated motor speed being larger than the magnitude of current at other frequencies. In some cases, a current magnitude may also need to be above a noise floor to be considered a clear peak. That is, the peak may be a multiple above other current magnitudes to be considered a peak (for example, a magnitude that is two to three times the magnitude of other current magnitudes may constitute a peak. However, two to three times the magnitude may be an arbitrary selection and any other multiple may be used as well). If it is determined in operation 216 that there is a clear peak, then the flow chart 200 proceeds to operation 218. Otherwise, the flow chart 200 proceeds to operation 206. At operation 218, the rotational frequency of the machine (for example, the estimation of the motor speed) may be determined as the frequency at which the clear peak is identified.

Continuing with FIG. 2, if it is determined at operation 204 that the machine is not configured to use inherent machine asymmetry for speed estimation, then the flow chart 200 may proceed to operation 206. At operation 206, it may be determined if torque current-based speed estimation is enabled. If torque current-based speed estimation is enabled, then the flow chart 200 may proceed to operation 208. Torque current-based speed estimation may be enabled during the commissioning and may be based on the availability of certain sensors. Otherwise, the flow chart 200 may proceed to operation 210. At operation 208, the speed of the motor may be then be estimated from the torque component of the current. For example, the speed estimate may be determined using Equations 13-18 presented above. At operation 210, the speed of the motor may be estimated based on an assumption that the slip of the machine is half of the rated slip of the machine. Once the speed of the machine is estimated through either operation 208, operation 210, and/or operation 218, the flow chart 200 may proceed to flow chart 300.

Figure 3:
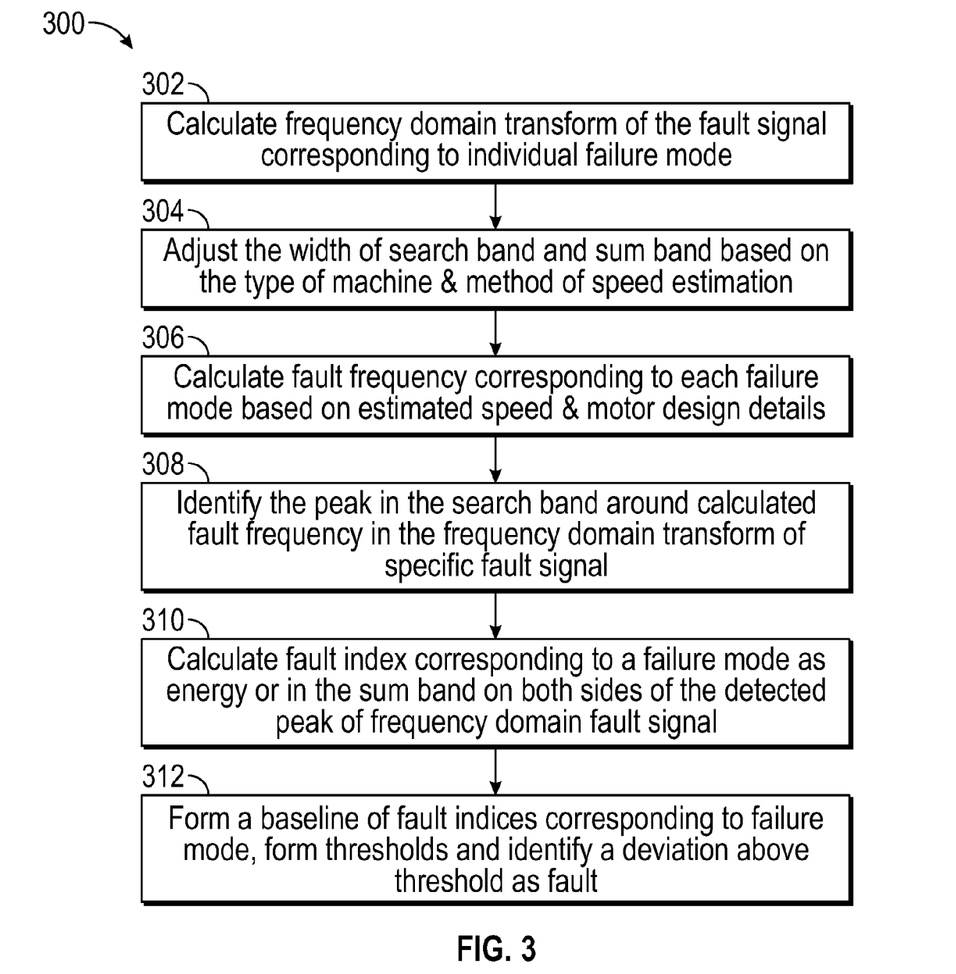
FIG. 3 depicts an example flow chart, in accordance with one or more example embodiments of the disclosure.

Turning to FIG. 3, in some embodiments, once the speed estimate for the machine is determined, for example, through flow charts 100 and 200, operations may continue with flow chart 300. Flow chart 300, for example, may be used to establish a fault index for one or more different types of failure modes of the machine (examples of failure modes may include eccentricity, broken rotor bar, or bearing fault failure modes). The fault index corresponding to a specific failure mode may be defined as the energy or square root of sum of squares of the frequency domain points in the sum band (which may be defined below) on both sides of the detected peak in the frequency domain transform of specific fault signal. The energy may or may not be normalized depending on the application and the failure mode. Baselines for the machine for different types of fault modes may then be established, and may be used to determine if an electrical fault exists in the machine (for example, based on the determined fault index baselines).

Continuing with FIG. 3, The flow chart 300 may begin with operation 302, which may include determining a frequency domain transform of a fault signal corresponding to an individual failure mode. That is, different types of machine failure modes may be associated with different fault frequencies. Accordingly, different fault indexes and different baselines may be established for individual types of failure modes using these systems and methods. In some cases, the frequency domain transform may be based on a Fast Fourier Transform (FFT), Discrete Fourier Transform (DFT), or Short-time Fourier Transform (STFT), among other frequency domain transforms. At operation 304, the width of a search band and sum band may be adjusted based on information associated with the machine. A search band may be a frequency range that may be determined and used to search for a fault frequency. For example, a fault frequency may be identified within the frequency range of the search band as a peak magnitude within the frequency range of the search band (for example, as may be performed in operation 308 described below). A sum band may be a more narrow (or in some cases may be wider) frequency range than the search band. The sum band may represent a frequency range including a certain number of data points (for example, frequency values) to the left and to the right of the determined fault frequency identified in the search band. If the data resolution is higher, then the sum band may be selected with more data points and if the data resolution is lower, then the sum band may be selected with less data points.

In some embodiments, the information used to adjust the width of the search band and/or sum band may include, for example, the type of machine (for example, synchronous or induction machine, among other machine types) and the method of speed estimation used (for example, the different speed estimation methods described in the flow charts 100 and/or 200 of FIGS. 1 and 2). As a first example, this adaptive adjustment of the search and sum bands may be a function of a rated slip frequency of the machine. As a second example, the adaptive adjustment may be a function of a frequency resolution of a frequency domain transform. As a third example, the adaptive adjustment may also involve learning an optimized search and sum band size for a machine of one design, and may reapply those same optimized search and sum band sizes for a machine of similar design. As a fourth example, a more narrow search band may be used when a certain types of speed estimation are used, such as when input power, a torque component of the current, or machine asymmetry are used (which may be more accurate speed estimations, for example) and a wider search band may be used based on methods of speed estimation that may not involve these elements (for example, which may be lower accuracy methods of speed estimation). The search and sum bands may be narrowed in certain cases because if the accuracy of the speed estimation of the machine is more reliable, then it may be more likely that a fault frequency may be located nearby the determined speed of the machine in a frequency spectrum. Thus, a narrower search band can be used to identify the fault frequency. However, if the speed estimation is determined using less accurate methods, then a larger search band may be necessary because the fault frequency may potentially fall further from the estimated speed of the machine in a frequency spectrum. Specific examples of search and sum bands that may be used in different instances may be presented in FIGS. 4A-4C. In some embodiments, once the search band and/or sum band are established and/or adjusted, at operation 306, a fault frequency corresponding to the failure mode of the fault signal may be determined. The fault frequency for the different types of failure modes may be derived from the estimated motor speed, nameplate details, and the machine geometry (for example, the bearing dimensions are used to estimate the bearing fault frequency).

Example formulas used to derive the fault frequencies for eccentricity, broken rotor bar and bearing faults are given below. The fault frequency for eccentricity in the stator current FFT may be calculated as:

$$f_{ecc} = f_s +/- k f_r \qquad \text{(Equation 15)}$$

where $f_s$ may be the fundamental frequency and $f_r$ may be the estimated rotational speed in Hz, and k ay represent the harmonic order. In the square of the stator current spectrum, the eccentricity characteristic frequency may be $$f_{ecc} = k f_r \qquad \text{(Equation 16)}$$

The fault frequency for bearing faults in the stator current FFT for different bearing defects depend on the bearing geometry and rotational frequency (for a single point defect in the bearing) and may be given as:

$$f_{bearing} = f_s +/- k f_c \qquad \text{(Equation 17)}$$

where $f_c$ for the inner $f_o$, outer race $f_i$ and ball defects $f_b$ can be calculated as:

$$\text{Outer Raceway:} f_0 = \frac{N_b}{2} f_r \left(1 - \frac{D_b}{D_c} \cos\beta\right) \qquad \text{(Equation 18)}$$

$$\text{Inner Raceway:} f_i = \frac{N_b}{2} f_r \left(1 + \frac{D_b}{D_c} \cos\beta\right) \qquad \text{(Equation 19)}$$

$$\text{Ball}: f_b = \frac{D_c}{D_b} f_r \left(1 - \frac{D_b^2}{D_c^2} \cos^2\beta\right), \qquad \text{(Equation 20)}$$

where Nb may be the number of rolling element, Dc may be the cage diameter and Db may be the rolling element (ball) diameter and $f_r$ may be the rotational speed in Hz. Typically, the contact angle β may be assumed to be zero.

In the square of the stator current spectrum, the bearing characteristic frequency may be $$f_{bearing} = k f_c \qquad \text{(Equation 21)}$$

The fault frequency for the broken rotor bar in the stator current FFT may be calculated as:

$$f_{brb} = f_s +/- 2 k s f_s \qquad \text{(Equation 22)}$$

where s may be the slip of the machine determined from the machine operating speed and $sf_s$ may be the electrical slip frequency of the machine in Hz. In the square of the stator current spectrum, the broken rotor bar characteristic frequency may be determined as $$f_{brb} = 2 k s f_s \qquad \text{(Equation 23)}$$

Figure 7:
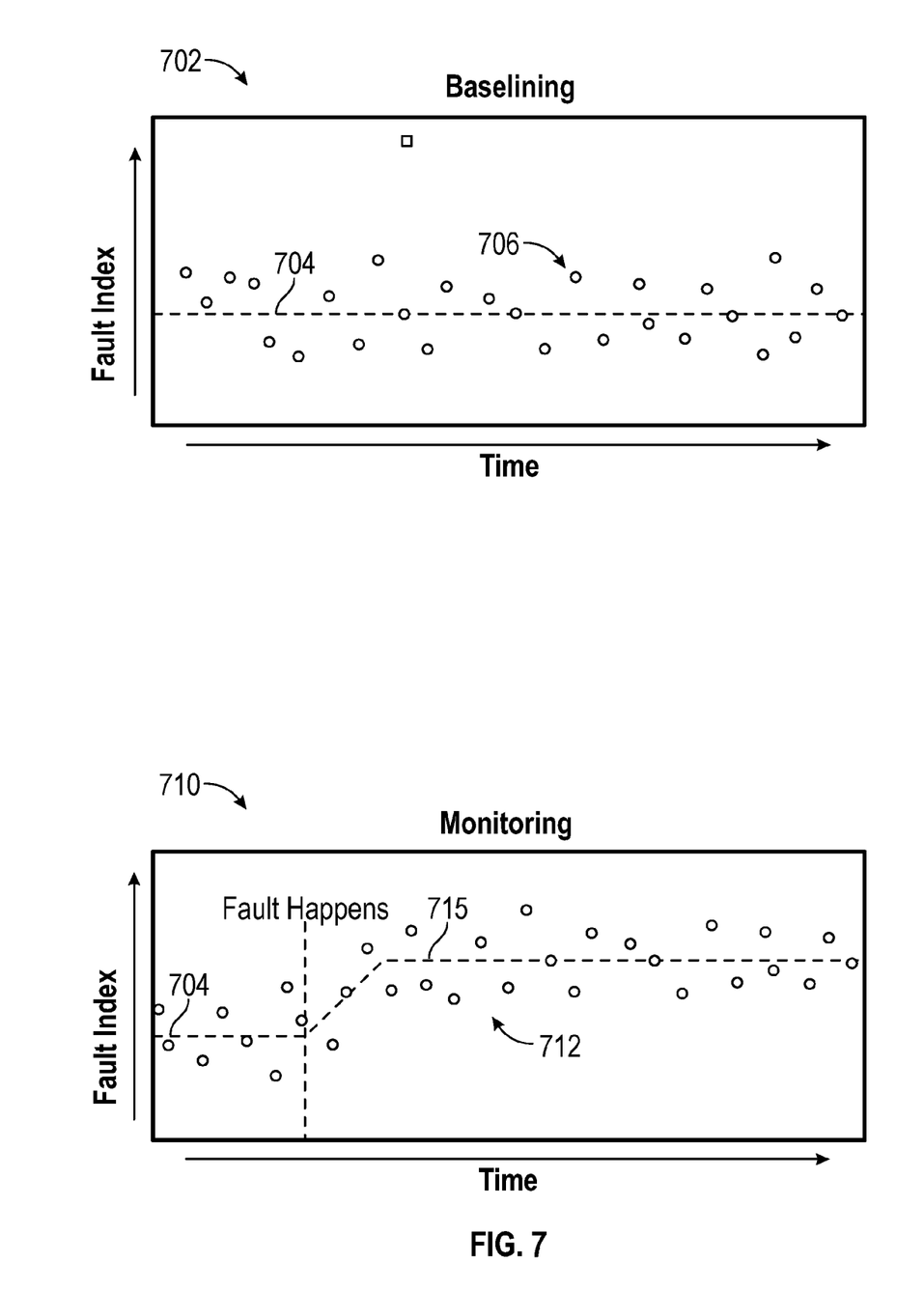
FIG. 7 depicts an illustrative comparison of a baseline and real-time data, in accordance with one or more example embodiments of the disclosure.

Continuing with FIG. 3, at operation 308, one or more peaks may be identified in the search band. In some cases, the peak may be the greatest magnitude within the defined search band. In some cases, the peaks may be located around the fault frequency in the frequency domain transform of the fault signal. The peak may be a multiple above other current magnitudes to be considered a peak (for example, a magnitude that is two to three times the magnitude of other current magnitudes may constitute a peak. However, two to three times the magnitude may be an arbitrary selection and any other multiple may be used as well). At operation 310, one or more fault indices may be determined for the failure mode as an energy in the sum band on both sides of the determined peak of the frequency domain fault signal. At operation 312, a baseline of fault indices corresponding to certain failure modes may be established, and these baselines may be used to identify a deviation above the threshold as a fault. That is, during commissioning of the machine, a baseline of fault indices corresponding to different failure modes may be established. A threshold may be calculated for each failure mode based on the statistics of data collected in the baseline and additional preconfigured conditions which are tuneable. Once baselining is complete with minimum number of points being captured, the system may be configured to compare a moving average of fault index points with the calculated thresholds and a fault alarm may be generated when a fault index exceeds a determined threshold. For example, a baseline may include one or more determined fault indices (it should be noted that reference may be made herein to "a fault index," but multiple fault indices may be determined for a failure mode to establish a baseline as well) and the threshold may be based on a mean, standard deviation or any other statistical measure of the baseline fault indices. Then, if during real-time operation of the machine, a mean of the data being captured is above the mean of the baseline fault indices by the threshold amount for a particular type of failure mode, then it may be determined that a fault indicative of that particular type of failure mode may be taking place. For example, if indices corresponding to the fault frequency of a bearing fault are determined to be above the baseline threshold, then it may be determined that a bearing fault may have taken place. This may be further illustrated in FIG. 7. FIG. 7 may depict a first plot 702 including a baseline 704 established by one or more fault indices 706 for a type of failure mode determined using the systems and methods described herein. FIG. 7 may also depict a second plot 710 indicating a fault condition taking place. The second plot 710 may show one or more data points 712 that may be captured during real-time operation of the machine. During a time period, it is depicted that a mean value 715 of the one or more data points 712 is greater than the baseline 704 by a particular amount. Based on this, it may be determined that a fault of the particular type of failure mode has taken place.

It should be noted that the operations described and depicted in the illustrative flow diagrams of FIGS. 1-3 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 1-3 may be performed.

One or more operations of the process flows of FIGS. 1-3 may have been described above as being performed by a user device, or more specifically, by one or more program modules, applications, or the like executing on a device. It should be appreciated, however, that any of the operations of process flows of FIGS. 1-3 may be performed, at least in part, in a distributed manner by one or more other devices, or more specifically, by one or more program modules, applications, or the like executing on such devices. In addition, it should be appreciated that processing performed in response to execution of computer-executable instructions provided as part of an application, program module, or the like may be interchangeably described herein as being performed by the application or the program module itself or by a device on which the application, program module, or the like is executing.

Figure 4A:
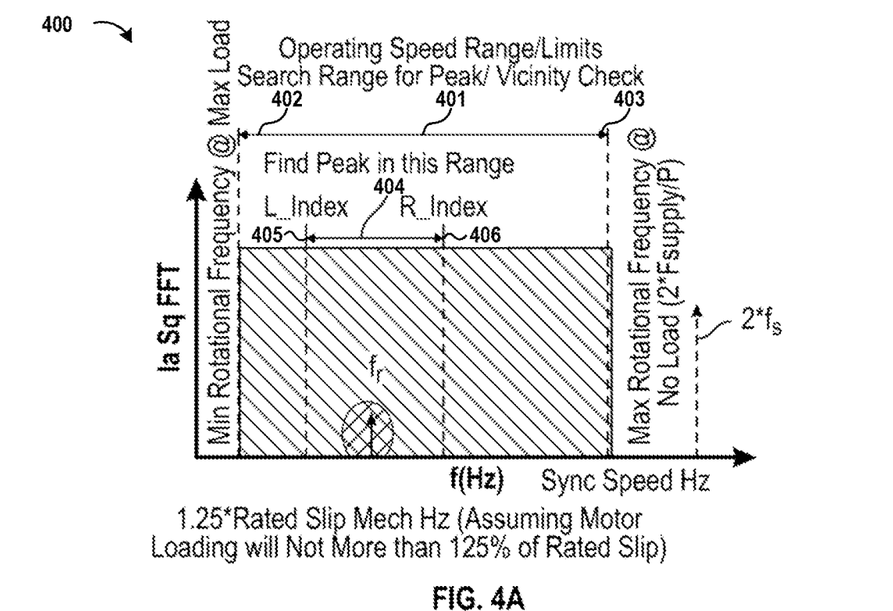
FIGS. 4A-4C depict example search and sum bands, in accordance with one or more example embodiments of the disclosure.
Figure 4B:
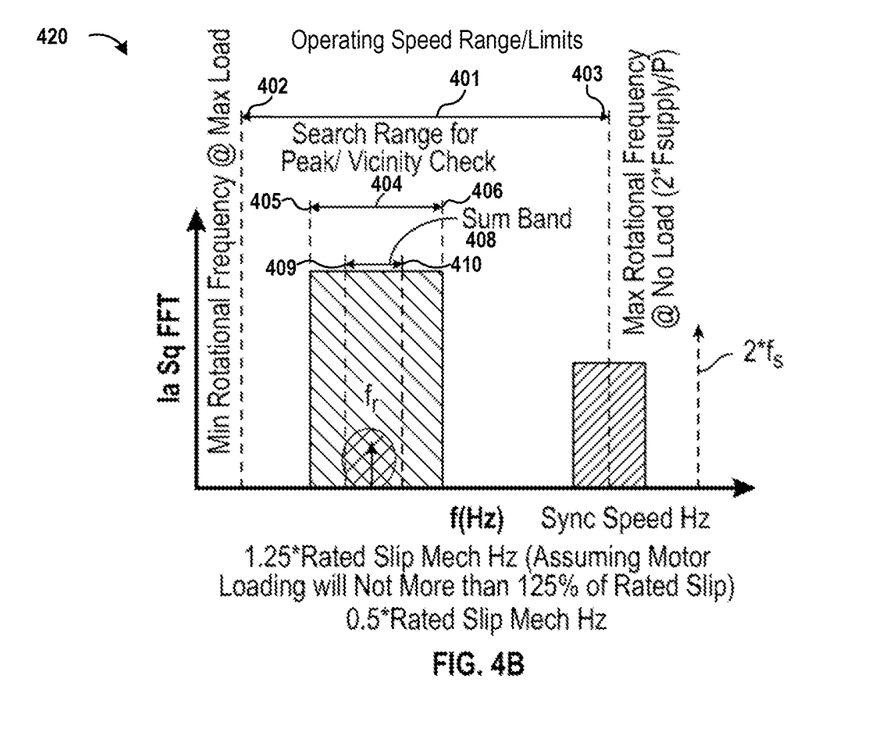
Figure 4C:
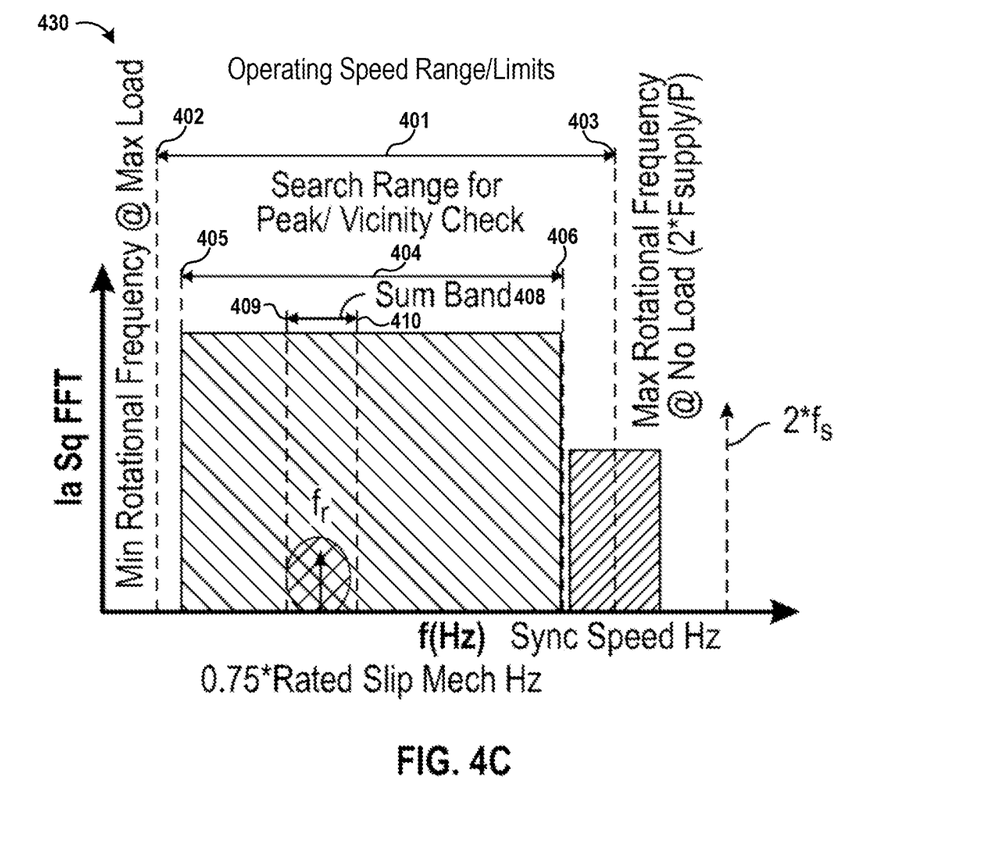

In some embodiments, FIGS. 4A-4C depict example search and sum bands, in accordance with one or more example embodiments of the disclosure. In some embodiments, FIG. 4A may depict an example of a search band that may be used to determine a fault frequency for a particular type of failure mode. FIG. 4A may depict an example plot 400. The plot 400 may be a plot of the frequency domain transform of a signal from the machine. That is, the plot 400 may depict the IaSq FFT (which may be the square of the stator current Fast Fourier Transform) of the signal as a function of frequency in Hertz. The plot 400 may include a frequency range 401, which may be an operating range of the machine. For example, the frequency range may include a lower operating frequency 402 and an upper operating frequency 403. The lower operating frequency 402 may include the minimum rotational frequency of the machine at a maximum load. The upper operating frequency 403 may be the maximum rotational frequency of the machine at no load. The upper operating frequency 403 may also be the synchronous speed of the machine. In some cases, the lower operating frequency 402 and upper operating frequency 403 may be determined by multiplying the rated slip speed of the machine by a factor. The lower operating frequency 402 may extend to the left by an amount corresponding to the resulting value and the upper operating frequency 403 may extend to the right by an amount corresponding to the resulting value. That is, the lower operating frequency 402 and upper operating frequency 403 may extend outwards from the estimated speed of the machine by an amount corresponding to the resulting value of this calculation. The plot 400 may also depict a search band 404, which may be a range of frequencies within the frequency range 401 of the machine. The search band 404 may range from a lower search band frequency 405 to an upper search band frequency 406 and may be used to identify a peak magnitude. The search band may be determined, for example, based on adjustments described as being performed in flow chart 300 of FIG. 3, or may be determined in any number of other ways.

In some embodiments, FIG. 4B may depict an example plot 420. The example plot 420 may be the same as plot 400 to exemplify how a sum band may be determined for the search band 404 established in plot 400 of FIG. 4A. That is, plot 400 may include the same operating frequency range 401, and may include the same search band 404, including the same lower search band frequency 405 and upper search band frequency 406. The plot 420 may also include a depiction of a sum band 408 within the search band 404 of the machine. The sum band 408 may include a lower sum band frequency 409 and an upper sum band frequency 410. In some instances, the lower sum band frequency 409 and an upper sum band frequency 410 may be determined as being located a predetermined distance from the estimated speed of the machine, which may be represented as fr. Indices may indicate frequency values in the plot.

In some embodiments, FIG. 4C may depict an example plot 430. The example plot 430 may be similar to plot 400 of FIG. 4A and plot 420 of FIG. 4B in that an example search band 404 and sum band 408 are depicted. The plot 430 in FIG. 4C may differ, however, in that the search band 404 may be depicted as being wider in plot 430 than in plot 400 or plot 420. FIG. 4C may be an example of a wider search band that may be used if a less accurate estimation of the speed of the machine is used. For instance, the wider search band 404 depicted in FIG. 4C may be used when lower accuracy methods of motor speed estimation are used (for example, when input power, a torque component of the current, or machine asymmetry are not used to determine the speed estimate). Likewise, the more narrow search band 404 depicted in FIGS. 4A-4B when these more accuracy speed estimation methods are used.

Illustrative Methods

Figure 5:
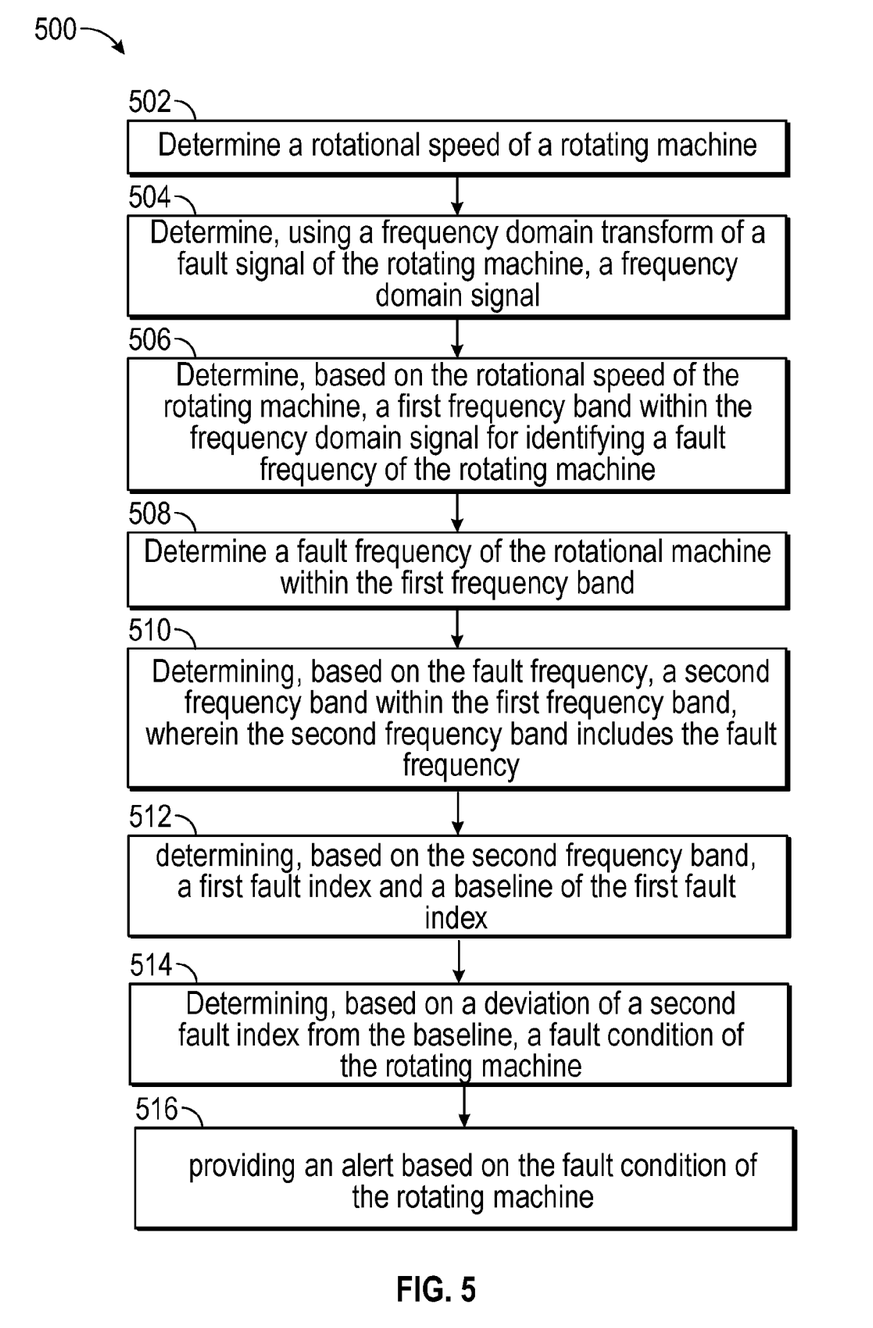
FIG. 5 depicts an example method, in accordance with one or more example embodiments of the disclosure.

FIG. 5 is an example method 500 in accordance with one or more example embodiments of the disclosure. At block 502 of the method 500 in FIG. 5, the method may include determining a rotational speed of a rotating machine. Block 504 of the method 500 may include determining, using a frequency domain transform of a signal of the rotating machine, a frequency domain signal. Block 506 of the method 500 may include determining, based on the rotational speed of the rotating machine, a first frequency band within the frequency domain signal for identifying a fault frequency of the rotating machine. Block 508 of the method 500 may include determining a fault frequency of the rotational machine within the first frequency band. Block 510 of the method 500 may include determining, based on the fault frequency, a second frequency band within the first frequency band, wherein the second frequency band includes the fault frequency. Block 512 of the method 500 may include determining, based on the second frequency band, a first fault index and a baseline of the first fault index. Block 514 of the method 500 may include determining, based on a deviation of a second fault index from the baseline, a fault condition of the rotating machine. Block 516 of the method may include providing an alert based on the fault condition of the rotating machine.

The operations described and depicted in the illustrative process flow of FIG. 5 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIG. 5 may be performed.

One or more operations of the process flows of FIG. 5 may have been described above as being performed by a user device, or more specifically, by one or more program modules, applications, or the like executing on a device. It should be appreciated, however, that any of the operations of process flows of FIG. 5 may be performed, at least in part, in a distributed manner by one or more other devices (for example, locally at the machine, on a remote system, such as a cloud system, or the like), or more specifically, by one or more program modules, applications, or the like executing on such devices. In addition, it should be appreciated that processing performed in response to execution of computer-executable instructions provided as part of an application, program module, or the like may be interchangeably described herein as being performed by the application or the program module itself or by a device on which the application, program module, or the like is executing.

Illustrative System Architecture

Figure 6:
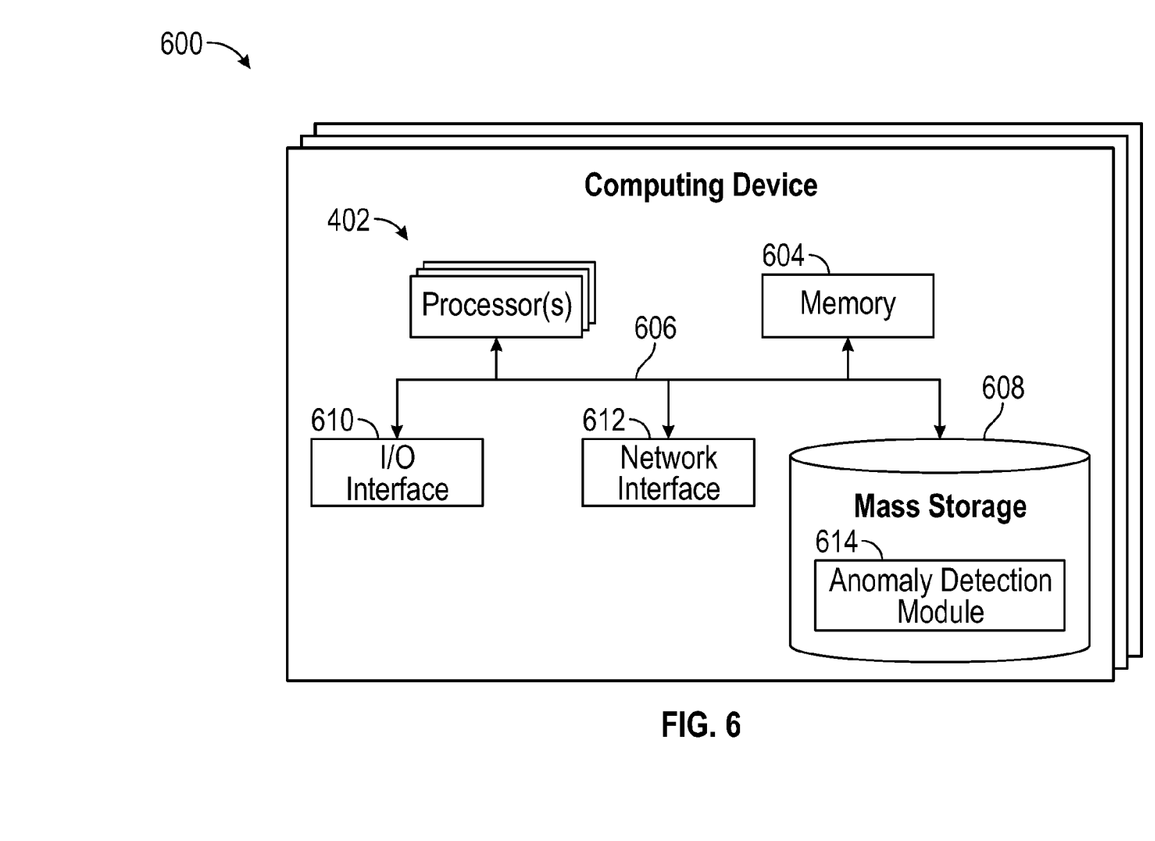
FIG. 6 depicts an illustrative computing device, in accordance with one or more example embodiments of the disclosure.

FIG. 6 illustrates an example computing device 600, in accordance with one or more embodiments of this disclosure. The computing 600 device may be representative of a device that may be used to perform any of the operations described herein (for example, operations described with respect to any of the flow charts depicted in FIGS. 1-3 and 5, or any other operations associated with anomaly detection). For example, the computing device 600 may be a digital signal processing (DSP) device, a relay, or any other type of device suitable to perform the operations described herein. The computing device 600 may also be located locally to the machine or may be remote (for example, a remote server). The computing device 600 may include at least one processor 602 that executes instructions that are stored in one or more memory devices (referred to as memory 604). The instructions can be, for instance, instructions for implementing functionality described as being carried out by one or more modules and systems disclosed above or instructions for implementing one or more of the methods disclosed above. The processor(s) 602 can be embodied in, for example, a CPU, multiple CPUs, a GPU, multiple GPUs, a TPU, multiple TPUs, a multi-core processor, a combination thereof, and the like. In some embodiments, the processor(s) 602 can be arranged in a single processing device. In other embodiments, the processor(s) 602 can be distributed across two or more processing devices (e.g., multiple CPUs; multiple GPUs; a combination thereof; or the like). A processor can be implemented as a combination of processing circuitry or computing processing units (such as CPUs, GPUs, or a combination of both). Therefore, for the sake of illustration, a processor can refer to a single-core processor; a single processor with software multithread execution capability; a multi-core processor; a multi-core processor with software multithread execution capability; a multi-core processor with hardware multithread technology; a parallel processing (or computing) platform; and parallel computing platforms with distributed shared memory. Additionally, or as another example, a processor can refer to an integrated circuit (IC), an ASIC, a digital signal processor (DSP), a FPGA, a PLC, a complex programmable logic device (CPLD), a discrete gate or transistor logic, discrete hardware components, or any combination thereof designed or otherwise configured (e.g., manufactured) to perform the functions described herein.

The processor(s) 602 can access the memory 604 by means of a communication architecture 606 (e.g., a system bus). The communication architecture 606 may be suitable for the particular arrangement (localized or distributed) and type of the processor(s) 602. In some embodiments, the communication architecture 606 can include one or many bus architectures, such as a memory bus or a memory controller; a peripheral bus; an accelerated graphics port; a processor or local bus; a combination thereof; or the like. As an illustration, such architectures can include an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, a Peripheral Component Interconnect (PCI) bus, a PCI-Express bus, a Personal Computer Memory Card International Association (PCMCIA) bus, a Universal Serial Bus (USB), and or the like.

Memory components or memory devices disclosed herein can be embodied in either volatile memory or non-volatile memory or can include both volatile and non-volatile memory. In addition, the memory components or memory devices can be removable or non-removable, and/or internal or external to a computing device or component. Examples of various types of non-transitory storage media can include hard-disc drives, zip drives, CD-ROMs, digital versatile discs (DVDs) or other optical storage, magnetic cassettes, magnetic tape, magnetic disk storage or other magnetic storage devices, flash memory cards or other types of memory cards, cartridges, or any other non-transitory media suitable to retain the desired information and which can be accessed by a computing device.

As an illustration, non-volatile memory can include read only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The disclosed memory devices or memories of the operational or computational environments described herein are intended to include one or more of these and/or any other suitable types of memory.

Each computing device 600 also can include mass storage 608 that is accessible by the processor(s) 602 by means of the communication architecture 606. The mass storage 608 can include machine-accessible instructions (e.g., computer-readable instructions and/or computer-executable instructions). In some embodiments, the machine-accessible instructions may be encoded in the mass storage 608 and can be arranged in components that can be built (e.g., linked and compiled) and retained in computer-executable form in the mass storage 608 or in one or more other machine-accessible non-transitory storage media included in the computing device 600. Such components can embody, or can constitute, one or many of the various modules disclosed herein. Such modules are illustrated as anomaly detection module 614.

Execution of the anomaly detection module 614, individually or in combination, by at least one of the processor (s) 602, can cause the computing device 600 to perform any of the operations described herein (for example, operations described with respect to any of the flow charts depicted in FIGS. 1-3 and 5, or any other operations associated with anomaly detection).

Each computing device 600 also can include one or more input/output interface devices 610 (referred to as I/O interface 610) that can permit or otherwise facilitate external devices to communicate with the computing device 600. For instance, the I/O interface 610 may be used to receive and send data and/or instructions from and to an external computing device. The computing device 600 also includes one or more network interface devices 612 (referred to as network interface(s) 612) that can permit or otherwise facilitate functionally coupling the computing device 600 with one or more external devices. Functionally coupling the computing device 600 to an external device can include establishing a wireline connection or a wireless connection between the computing device 600 and the external device. Such a communication processing device can process data according to defined protocols of one or several radio technologies. The radio technologies can include, for example, 3G, Long Term Evolution (LTE), LTE-Advanced, 5G, IEEE 802.11, IEEE 802.16, Bluetooth, ZigBee, near-field communication (NFC), and the like.

As used in this application, the terms "environment," "system," "unit," "module," "architecture," "interface," "component," and the like refer to a computer-related entity or an entity related to an operational apparatus with one or more defined functionalities. The terms "environment," "system," "module," "component," "architecture," "interface," and "unit," can be utilized interchangeably and can be generically referred to functional elements. Such entities may be either hardware, a combination of hardware and software, software, or software in execution. As an example, a module can be embodied in a process running on a processor, a processor, an object, an executable portion of software, a thread of execution, a program, and/or a computing device. As another example, both a software application executing on a computing device and the computing device can embody a module. As yet another example, one or more modules may reside within a process and/or thread of execution. A module may be localized on one computing device or distributed between two or more computing devices. As is disclosed herein, a module can execute from various computer-readable non-transitory storage media having various data structures stored thereon. Modules can communicate via local and/or remote processes in accordance, for example, with a signal (either analogic or digital) having one or more data packets (e.g., data from one component interacting with another component in a local system, distributed system, and/or across a network such as a wide area network with other systems via the signal).

As yet another example, a module can be embodied in or can include an apparatus with a defined functionality provided by mechanical parts operated by electric or electronic circuitry that is controlled by a software application or firmware application executed by a processor. Such a processor can be internal or external to the apparatus and can execute at least part of the software or firmware application. Still in another example, a module can be embodied in or can include an apparatus that provides defined functionality through electronic components without mechanical parts. The electronic components can include a processor to execute software or firmware that permits or otherwise facilitates, at least in part, the functionality of the electronic components.

In some embodiments, modules can communicate via local and/or remote processes in accordance, for example, with a signal (either analog or digital) having one or more data packets (e.g., data from one component interacting with another component in a local system, distributed system, and/or across a network such as a wide area network with other systems via the signal). In addition, or in other embodiments, modules can communicate or otherwise be coupled via thermal, mechanical, electrical, and/or electro-mechanical coupling mechanisms (such as conduits, connectors, combinations thereof, or the like). An interface can include input/output (I/O) components as well as associated processors, applications, and/or other programming components.

Further, in the present specification and annexed drawings, terms such as "store," "storage," "data store," "data storage," "memory," "repository," and substantially any other information storage component relevant to the operation and functionality of a component of the disclosure, refer to memory components, entities embodied in one or several memory devices, or components forming a memory device. It is noted that the memory components or memory devices described herein embody or include non-transitory computer storage media that can be readable or otherwise accessible by a computing device. Such media can be implemented in any methods or technology for storage of information, such as machine-accessible instructions (e.g., computer-readable instructions), information structures, program modules, or other information objects.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of systems, devices, techniques, and computer program products that, individually and in combination, permit the anomaly detection in machines. It is, of course, not possible to describe every conceivable combination of components and/or methods for purposes of describing the various elements of the disclosure, but it can be recognized that many further combinations and permutations of the disclosed elements are possible. Accordingly, it may be apparent that various modifications can be made to the disclosure without departing from the scope or spirit thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

That which is claimed is:

1. A system comprising:
    at least one processor; and
    at least one memory storing computer-executable instructions, that when executed by the at least one processor, cause the at least one processor to:
    determine a rotational speed of a rotating machine;
    determine, using a frequency domain transform of a signal of the rotating machine, a frequency domain signal;
    determine, based on a predetermined frequency distance from the rotational speed of the rotating machine, a first frequency band within the frequency domain signal for identifying a fault frequency of the rotating machine;
    determine a fault frequency of the rotational machine within the first frequency band;
    determine, based on the fault frequency, a second frequency band within the first frequency band, wherein the second frequency band includes the fault frequency;
    determine, based on the second frequency band, a first fault index indicative of a failure mode, and a baseline of the first fault index for detecting a fault condition;
    determine, based on a deviation from the baseline, the fault condition of the rotating machine; and
    provide an alert based on the fault condition of the rotating machine.

2. The system of claim 1, wherein determining the rotational speed of a rotating machine is further based on at least one of: a type of rotational machine, nameplate details of the rotating machine, or sampled input signals from the rotational machine.

3. The system of claim 1, wherein the computer-executable instructions further cause the at least one processor to:
    determine that a voltage measurement signal for the rotating machine is available; and
    determine that the rotating machine is an induction machine,
    wherein determining the rotational speed of the rotating machine is based on an input power of the rotating machine.

4. The system of claim 1, wherein the computer-executable instructions further cause at least one processor to:
    determine that a voltage signal for the rotating machine is unavailable; and
    determine that the rotating machine is an induction machine,
    wherein determining the rotational speed of the rotating machine is based on a torque components of a input current of the rotating machine.

5. The system of claim 1, wherein the computer-executable instructions further cause at least one processor to:
    determine that a voltage signal for the rotating machine is unavailable; and
    determine that the rotating machine is an induction machine; and
    wherein determining the rotational speed of the rotating machine is based on a determined peak corresponding to inherent asymmetry in a frequency domain transform of a fault signal of the rotating machine.

6. The system of claim 1, wherein the computer-executable instructions further cause at least one processor to:
    determine that a voltage signal for the rotating machine is unavailable;
    determine that the rotating machine is an induction machine; and
    wherein determining the rotational speed of the rotating machine is based on a synchronous speed of the rotating machine and a rated slip speed of the rotating machine.

7. The system of claim 1, wherein the computer-executable instructions further cause at least one processor to:
    determine that the rotating machine is a synchronous machine,
    wherein determining the rotational speed of a rotating machine further comprises determining that the rotational speed of the rotating machine is a synchronous speed of the rotating machine calculated from an estimated fundamental frequency.

8. The system of claim 1, wherein determining the first frequency band or the second frequency band is further based on at least one of: the rotational speed of the rotating machine, a type of speed estimation used, a frequency resolution of the frequency domain transform of the fault condition, or nameplate information associated with the rotating machine.

9. The system of claim 1, wherein the failure mode comprises one of: eccentricity, broken rotor bar, bearing fault, or any other mechanical, thermal or electrical fault.

10. The system of claim 1, wherein the baseline comprises one or more fault indices along with their mean and standard deviation, and wherein determining the fault condition of the rotating machine further comprises determining that a mean value of fault index data received from the rotating machine during operation of the rotating machine is greater than a mean of baseline fault indices value by a threshold amount.

11. A method comprising:
    determining a rotational speed of a rotating machine;
    determining, using a frequency domain transform of a signal of the rotating machine, a frequency domain signal;
    a predetermined frequency distance from the rotational speed of the rotating machine, a first frequency band within the frequency domain signal for identifying a fault frequency of the rotating machine;
    determining a fault frequency of the rotational machine within the first frequency band;
    determining, based on the fault frequency, a second frequency band within the first frequency band, wherein the second frequency band includes the fault frequency;
    determining, based on the second frequency band, a first fault index indicative of a failure mode, and a baseline of the first fault index for determining a fault condition;
    determining, based on a deviation from the baseline, the fault condition of the rotating machine; and
    providing an alert based on the fault condition of the rotating machine.

12. The method of claim 11, wherein determining the rotational speed of a rotating machine is further based on at least one of: a type of rotational machine, nameplate details of the rotating machine, or sampled input signals from the rotational machine.

13. The method of claim 11, further comprising:
determining that a voltage measurement signal for the rotating machine is available; and
determining that the rotating machine is an induction machine,
wherein determining the rotational speed of the rotating machine is based on an input power of the rotating machine.

14. The method of claim 11, further comprising:
determining that a voltage signal for the rotating machine is unavailable; and
determining that the rotating machine is an induction machine,
wherein determining the rotational speed of the rotating machine is based on a torque components of a input current of the rotating machine.

15. The method of claim 11, further comprising:
determining that a voltage signal for the rotating machine is unavailable; and
determining that the rotating machine is an induction machine; and
wherein determining the rotational speed of the rotating machine is based on a determined peak corresponding to inherent asymmetry in a frequency domain transform of a fault signal of the rotating machine.

16. The method of claim 11, further comprising:
determining that a voltage signal for the rotating machine is unavailable;
determining that the rotating machine is an induction machine; and
wherein determining the rotational speed of the rotating machine is based on a synchronous speed of the rotating machine and a rated slip speed of the rotating machine.

17. The method of claim 11, further comprising:
determining that the rotating machine is a synchronous machine,
wherein determining the rotational speed of a rotating machine further comprises determining that the rotational speed of the rotating machine is a synchronous speed of the rotating machine calculated from an estimated fundamental frequency.

18. The method of claim 11, wherein determining the first frequency band or the second frequency band is further based on at least one of: the rotational speed of the rotating machine, a type of speed estimation used, a frequency resolution of the frequency domain transform of the fault condition, or nameplate information associated with the rotating machine.

19. The method of claim 11, wherein the failure mode comprises one of: eccentricity, broken rotor bar, bearing fault, or any other mechanical, thermal or electrical fault.

20. The method of claim 11, wherein the baseline comprises one or more fault indices along with their mean and standard deviation, and wherein determining the fault condition of the rotating machine further comprises determining that a mean value of fault index data received from the rotating machine during operation of the rotating machine is greater than a mean of baseline fault indices value by a threshold amount.

* * * * *